United States Patent
Ku et al.

(10) Patent No.: US 8,466,508 B2
(45) Date of Patent: Jun. 18, 2013

(54) NON-VOLATILE MEMORY STRUCTURE INCLUDING STRESS MATERIAL BETWEEN STACKED PATTERNS

(75) Inventors: Shaw-Hung Ku, Hsinchu (TW); Shih-Chin Lee, Hsinchu (TW); Chia-Wei Wu, Hsinchu (TW); Shang-Wei Lin, Hsinchu (TW); Tzung-Ting Han, Hsinchu (TW); Ming-Shang Chen, Hsinchu (TW); Wen-Pin Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 312 days.

(21) Appl. No.: 11/866,756

(22) Filed: Oct. 3, 2007

(65) Prior Publication Data
US 2009/0091983 A1    Apr. 9, 2009

(51) Int. Cl.
*H01L 29/792* (2006.01)
*H01L 29/788* (2006.01)
*H01L 21/762* (2006.01)

(52) U.S. Cl.
USPC ........ 257/324; 257/315; 257/501; 257/E29.3; 257/E29.309; 257/E21.545

(58) Field of Classification Search
USPC ...... 257/314–316, 324, 501, E29.3, E29.309, 257/E21.545
See application file for complete search history.

(56) References Cited

U.S. PATENT DOCUMENTS

| | | | |
|---|---|---|---|
| 4,833,514 A * | 5/1989 | Esquivel et al. | 257/316 |
| 6,924,181 B2 | 8/2005 | Huang et al. | |
| 7,041,543 B1 | 5/2006 | Varadarajan et al. | |
| 7,057,226 B2 * | 6/2006 | Lee | 257/314 |
| 7,119,404 B2 | 10/2006 | Chang et al. | |
| 7,214,630 B1 | 5/2007 | Varadarajan et al. | |
| 2004/0147076 A1 * | 7/2004 | Chen et al. | 438/257 |
| 2004/0257888 A1 * | 12/2004 | Noguchi et al. | 365/200 |
| 2006/0003510 A1 | 1/2006 | Kammler et al. | |
| 2006/0094194 A1 | 5/2006 | Chen et al. | |
| 2006/0148153 A1 | 7/2006 | Kwon et al. | |
| 2006/0270217 A1 | 11/2006 | Balseanu et al. | |
| 2006/0286758 A1 | 12/2006 | Liang et al. | |
| 2007/0010073 A1 | 1/2007 | Chen et al. | |
| 2007/0057316 A1 * | 3/2007 | Yaegashi | 257/321 |
| 2007/0096193 A1 | 5/2007 | Forbes et al. | 257/315 |
| 2007/0096195 A1 | 5/2007 | Hoentschel et al. | |
| 2007/0099414 A1 | 5/2007 | Frohberg et al. | |
| 2007/0105297 A1 | 5/2007 | Jeong et al. | |
| 2008/0017928 A1 * | 1/2008 | Hwang | 257/368 |

FOREIGN PATENT DOCUMENTS

| | | |
|---|---|---|
| CN | 101009327 | 8/2007 |
| TW | 578273 | 3/2004 |
| TW | 200603250 | 1/2006 |

* cited by examiner

*Primary Examiner* — Allison P Bernstein
(74) *Attorney, Agent, or Firm* — J.C. Patents

(57) ABSTRACT

A non-volatile memory structure including a substrate, stacked patterns and stress patterns is provided. The stacked patterns are disposed on the substrate. Each of the stacked patterns includes a charge storage structure and a gate from bottom to top. Here, the charge storage structure at least includes a charge storage layer. The stress patterns are disposed on the substrate between the two adjacent stacked patterns, respectively.

18 Claims, 2 Drawing Sheets

NON-VOLATILE MEMORY STRUCTURE INCLUDING STRESS MATERIAL BETWEEN STACKED PATTERNS

BACKGROUND OF THE INVENTION

1. Field of the Invention

The present invention relates to a memory structure and an array thereof, and more particularly to a non-volatile memory structure and an array thereof.

2. Description of Related Art

Among various non-volatile memories, an electrically erasable programmable read only memory (EEPROM) permits multiple data input, retrieval and erasure. Furthermore, input data can still be retained after a power supply to a device is removed. Therefore, the EEPROM has become one of the most popular memory devices adopted in personal computers and electronic equipment.

A typical EEPROM has a floating gate and a control gate which are both fabricated by doped polysilicon. As the memory is programmed, electrons injected into the floating gate are uniformly distributed in a polysilicon floating gate layer.

In addition, another conventional EEPROM employs a charge trapping layer as a replacement of the polysilicon floating gate, and the charge trapping layer is, for example, made of silicon nitride. Usually, a silicon oxide layer is disposed at respective sides of the silicon nitride charge trapping layer, so as to form a stacked gate structure including a silicon oxide/silicon nitride/silicon oxide (ONO) composite dielectric layer.

Silicon oxide isolation patterns used for isolating doped regions or separating two adjacent word lines are disposed on a substrate surrounding a channel region of the afore-mentioned conventional memory. To be more specific, the silicon oxide isolation patterns are disposed on the substrate above the doped regions or between the two adjacent word lines. However, the aforesaid conventional memory may have unfavorable electrical performance, such as low reading current, unsatisfactory transconductance (GM), low programming speed, short data retention time, and so on.

Furthermore, fabrications of the silicon oxide isolation patterns disposed above the doped regions require complicated manufacturing methods, such as a lift-off method, and so forth. Accordingly, production efficiency and yield rate of products may be deteriorated.

SUMMARY OF THE INVENTION

In view of the foregoing, the present invention is directed to a non-volatile memory structure which is conducive to simplifying a manufacturing process.

The present invention is further directed to a non-volatile memory array having desirable electrical performance.

The present invention provides a non-volatile memory structure including a substrate, a plurality of stacked patterns and a plurality of stress patterns. The stacked patterns are disposed on the substrate. Each of the stacked patterns includes a charge storage structure and a gate from bottom to top. Here, the charge storage structure at least includes a charge storage layer. The stress patterns are disposed on the substrate between two adjacent stacked patterns, respectively.

According to an embodiment of the present invention, the non-volatile memory structure further includes a plurality of doped regions respectively disposed in the substrate at two sides of each of the stacked patterns.

According to an embodiment of the present invention, in the non-volatile memory structure, a material of the stress patterns includes a tensile stress material when the doped regions are N-type doped regions.

According to an embodiment of the present invention, in the non-volatile memory structure, a material of the stress patterns includes a compressive stress material when the doped regions are P-type doped regions.

According to an embodiment of the present invention, in the non-volatile memory structure, a material of the charge storage layer includes doped polysilicon or silicon nitride.

According to an embodiment of the present invention, in the non-volatile memory structure, a material of the stress patterns includes silicon nitride.

According to an embodiment of the present invention, in the non-volatile memory structure, a width of each of the stress patterns is equal to a distance between every two adjacent stacked patterns.

The present invention further provides a non-volatile memory array including a substrate, a plurality of isolation patterns, a plurality of doped regions, a plurality of word lines, and a plurality of stacked patterns. The isolation patterns are disposed on the substrate in parallel and extend along a first direction. Besides, a material of the isolation patterns is a stress material. The doped regions are disposed in the substrate below the isolation patterns, respectively. The word lines are disposed on the isolation patterns in parallel and extend along a second direction. The first direction intersects the second direction. The stacked patterns are respectively disposed on the substrate below the word lines and between the two adjacent isolation patterns, and an opening is located between every two adjacent stacked patterns in the first direction. Each of the stacked patterns includes a charge storage structure and a gate from bottom to top, and the charge storage structure at least includes a charge storage layer.

According to an embodiment of the present invention, in the non-volatile memory array, a material of the charge storage layer includes doped polysilicon or silicon nitride.

According to an embodiment of the present invention, in the non-volatile memory array, the stress material includes silicon nitride.

According to an embodiment of the present invention, in the non-volatile memory array, the stress material includes a tensile stress material when the doped regions are N-type doped regions.

According to an embodiment of the present invention, in the non-volatile memory array, the stress material includes a compressive stress material when the doped regions are P-type doped regions.

According to an embodiment of the present invention, the non-volatile memory array further includes a dielectric layer disposed on the substrate and completely filling the openings.

According to an embodiment of the present invention, in the non-volatile memory array, a material of the dielectric layer includes the stress material.

According to an embodiment of the present invention, in the non-volatile memory array, a width of each of the isolation patterns is equal to a distance between every two adjacent stacked patterns in the second direction.

The present invention further provides another non-volatile memory array including a substrate, a plurality of isolation patterns, a plurality of doped regions, a plurality of word lines, a plurality of stacked patterns, and a dielectric layer. The isolation patterns are disposed on the substrate in parallel and extend along a first direction. The doped regions are disposed in the substrate below the isolation patterns, respectively. The word lines are disposed on the isolation patterns in parallel and extend along a second direction. The first direction intersects the second direction. The stacked patterns are respectively disposed on the substrate below the word lines and between the two adjacent isolation patterns, and an opening is located between every two adjacent stacked patterns in the first direction. Each of the stacked patterns includes a charge storage structure and a gate from bottom to top, and the charge storage structure at least includes a charge storage layer. The dielectric layer is disposed on the substrate and completely fills the openings. Besides, a material of the dielectric layer is a stress material.

According to another embodiment of the present invention, in the non-volatile memory array, a material of the charge storage layer includes doped polysilicon or silicon nitride.

According to another embodiment of the present invention, in the non-volatile memory array, the stress material includes silicon nitride.

According to another embodiment of the present invention, in the non-volatile memory array, the stress material includes a tensile stress material when the doped regions are N-type doped regions.

According to another embodiment of the present invention, in the non-volatile memory array, the stress material includes a compressive stress material when the doped regions are P-type doped regions.

Based on the above, in the non-volatile memory structure and the array thereof according to the present invention, the stress patterns are disposed on the substrate between two adjacent stacked patterns, and the stress patterns apply stresses to the substrate, thus permitting the non-volatile memory structure and the array thereof to have great electrical performance, such as high reading current, favorable GM, fast programming speed, long-lasting data retention, and so on.

Moreover, through the non-volatile memory structure and the array thereof according to the present invention, the manufacturing process can be effectively simplified, further improving production efficiency of the products.

In order to the make the aforementioned and other objects, features and advantages of the present invention comprehensible, several embodiments accompanied with figures are described in detail below.

DESCRIPTION OF EMBODIMENTS

Figure 1:
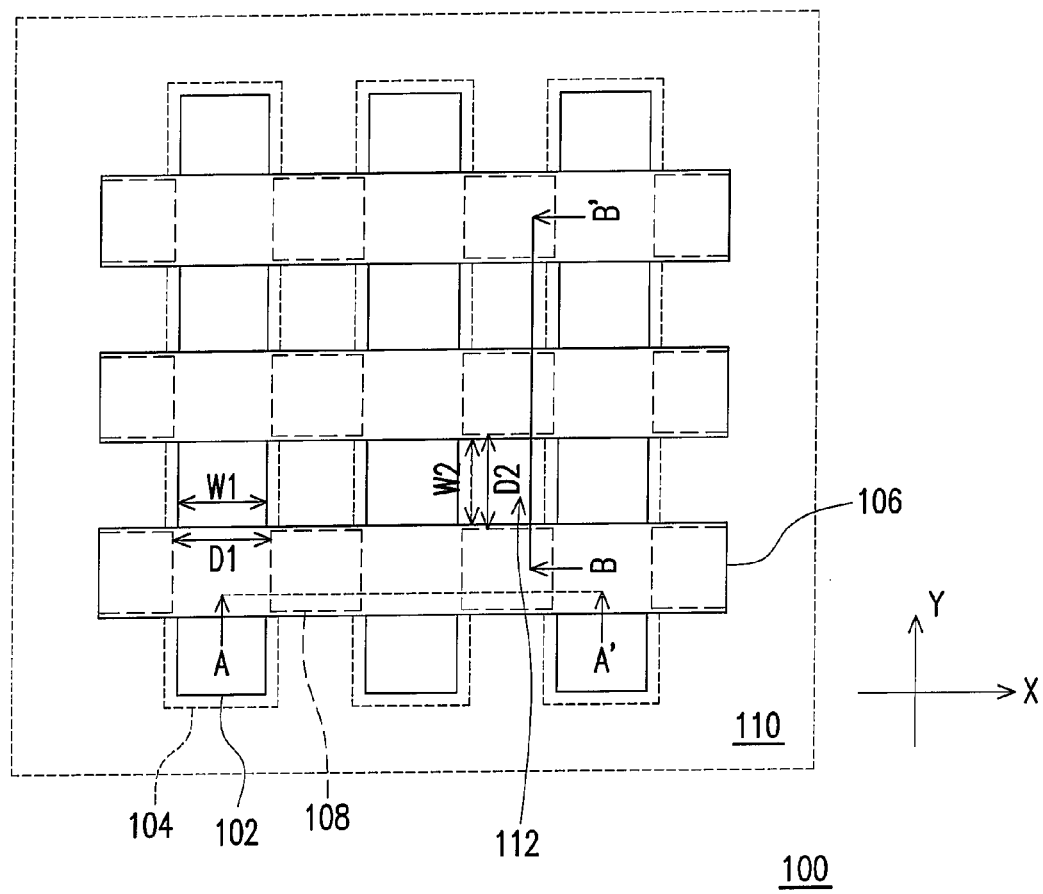
FIG. 1 is a top view illustrating a non-volatile memory array according to a first embodiment, a second embodiment, and a third embodiment of the present invention.
Figure 2:
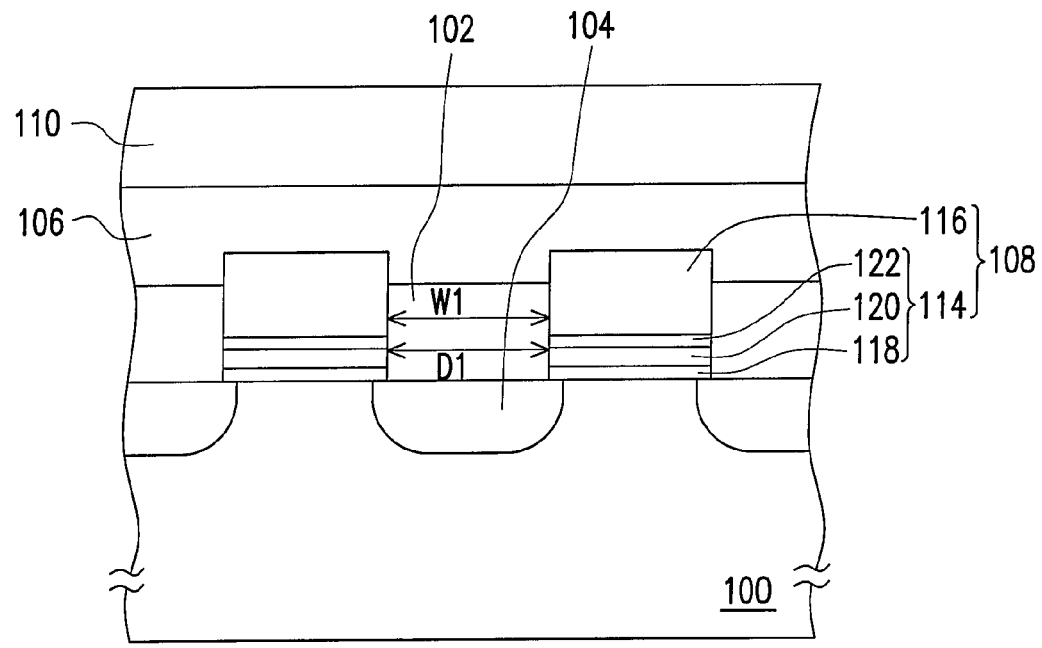
FIG. 2 is a cross-sectional view illustrating the non-volatile memory structure along a sectional line A-A' of FIG. 1 according to the first and the second embodiments of the present invention.
Figure 3:
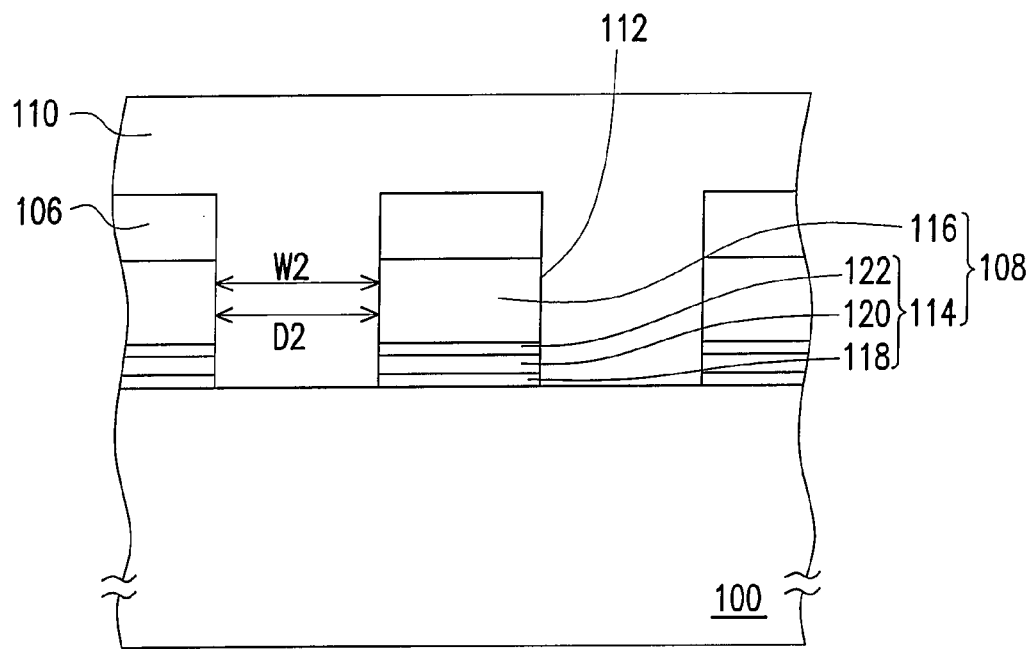
FIG. 3 is a cross-sectional view illustrating the non-volatile memory structure along a sectional line B-B' of FIG. 1 according to the first and the third embodiments of the present invention.

FIG. 1 is a top view illustrating a non-volatile memory array according to a first embodiment, a second embodiment, and a third embodiment of the present invention. FIG. 2 is a cross-sectional view illustrating the non-volatile memory structure along a sectional line A-A' of FIG. 1 according to the first and the second embodiments of the present invention. FIG. 3 is a cross-sectional view illustrating the non-volatile memory structure along a sectional line B-B' of FIG. 1 according to the first and the third embodiments of the present invention. In FIG. 1, the non-volatile memory array includes a substrate 100, a plurality of isolation patterns 102, a plurality of doped regions 104, a plurality of word lines 106, a plurality of stacked patterns 108, and a dielectric layer 110. In FIG. 2, the non-volatile memory structure includes the substrate 100, the isolation patterns 102, the doped regions 104, the word lines 106, the stacked patterns 108, and the dielectric layer 110. In FIG. 3, the non-volatile memory structure includes the substrate 100, the word lines 106, the stacked patterns 108, and the dielectric layer 110.

Referring to FIGS. 1 and 3, in the first embodiment, the isolation patterns 102 are disposed on the substrate 100 in parallel and extend along a first direction. The first direction is, for example, a Y-direction on an X-Y coordinate plane. A material of the isolation patterns 102 is a stress material, for example, a silicon nitride material having a stress, such that the isolation patterns 102 become stress patterns having the stresses. In addition, the stress material is, for example, a tensile stress material having a tensile stress when the doped regions 104 are N-type doped regions, whereas the stress material is, for example, a compressive stress material having a compressive stress when the doped regions 104 are P-type doped regions.

Besides, a width W1 of each of the isolation patterns 102 is equal to a distance D1 between every two adjacent stacked patterns 108 in a second direction. Here, the second direction is, for example, an X-direction on the X-Y coordinate plane. Aside from the above, people skilled in the pertinent art may adjust a height of each of the isolation patterns 102 based on manufacturing conditions and actual demands.

The doped regions 104 are disposed in the substrate 100 below the isolation patterns 102, respectively. Based on different requirements for various memories, the doped regions 104 may be the N-type doped regions or the P-type doped regions.

The word lines 106 are disposed on the isolation patterns 102 in parallel and extend along the second direction. The first direction intersects the second direction. A material of the word lines 106 is, for example, doped polysilicon.

The stacked patterns 108 are respectively disposed on the substrate 100 below the word lines 106 and between the two adjacent isolation patterns 102, and an opening 112 is located between every two adjacent stacked patterns 108 in the first direction. Each of the stacked patterns 108 includes a charge storage structure 114 and a gate 116 from bottom to top. In the second direction, the gates 116 are electrically connected to one another through the word lines 106. A material of the gates 116 is, for example, doped polysilicon.

The charge storage structure 114 includes a bottom dielectric layer 118, a charge storage layer 120 and a top dielectric layer 122 from bottom to top. The charge storage layer 120 may store charges and may be made of a conductive material including doped polysilicon or a charge trapping material including silicon nitride. The bottom dielectric layer 118 and the top dielectric layer 122 may block the charges from escaping out of the charge storage layer 120 and may be made of silicon oxide, for example.

The dielectric layer 110 is disposed on the substrate 100 and completely fills the openings 112. Besides, a material of the dielectric layer 110 is the stress material, e.g. the silicon nitride material having the stress. As such, the dielectric layer 110 becomes the stress patterns having the stresses. In addition, the stress material is, for example, the tensile stress material having the tensile stress when the doped regions 104 are the N-type doped regions. By contrast, when the doped regions 104 are the P-type doped regions, the stress material is, for example, the compressive stress material having the compressive stress. Additionally, the dielectric layer 110 in each of the openings 112 is disposed on the substrate 100 between every two adjacent stacked patterns 108 in the first direction, and a width W2 of the dielectric layer 110 in each of the openings 112 is equal to a distance D2 between every two adjacent stacked patterns 108 in the first direction.

According to the first embodiment, the stress patterns (the isolation patterns 102 and the dielectric layer 110 in each of the openings 112) are disposed on the substrate 100 between the two adjacent stacked patterns 108. The stress patterns apply the stresses to the substrate 100, thus permitting the non-volatile memory structure and the array thereof to have great electrical performance, such as high reading current, favorable GM, fast programming speed, long-lasting data retention, and so on.

Moreover, in the first embodiment, conventional silicon oxide isolation patterns formed on the doped regions are replaced by the isolation patterns 102 disposed on the doped regions 104. Thereby, the manufacturing process can be effectively simplified, further improving production efficiency of the products.

In the first embodiment, the isolation patterns 102 and the dielectric layer 110 are made of the stress material. However, given that either the isolation patterns 102 or the dielectric layer 110 is made of the stress material, the electrical performance can then be significantly improved. The second and the third embodiments are provided hereinafter for further demonstration.

Referring to FIGS. 1 and 2, in the second embodiment, the isolation patterns 102 are made of the stress material, such that the isolation patterns 102 become the stress patterns having the stresses. However, the dielectric layer 110 is made of a normal dielectric material including silicon oxide. Besides, the materials of other components, the arrangements thereof, and the performance thereof in the non-volatile memory structure according to the second embodiment are similar to those provided in the first embodiment, and thus further descriptions are omitted herein.

As the isolation patterns 102 are disposed on the substrate 100 between the two adjacent stacked patterns 108 in the second direction, the isolation patterns 102 may apply the stresses to the substrate 100, so as to improve the electrical performance of the non-volatile memory.

Moreover, in the second embodiment, the conventional silicon oxide isolation patterns formed on the doped regions are replaced by the isolation patterns 102 disposed on the doped regions 104. Thereby, the manufacturing process can be effectively simplified, further improving production efficiency of the products.

Referring to FIGS. 1 and 3, in the third embodiment, the dielectric layer 110 is made of the stress material, such that the dielectric layer 110 becomes the stress pattern having the stress. However, the isolation patterns 102 are made of the normal dielectric material including silicon oxide. Besides, the materials of other components, the arrangements thereof, and the performance thereof in the non-volatile memory structure according to the third embodiment are similar to those provided in the first embodiment, and thus further descriptions are omitted herein.

As the dielectric layer 110 in each of the openings 112 is disposed on the substrate 100 between the two adjacent stacked patterns 108 in the first direction, the dielectric layer 110 in each of the openings 112 may apply the stress to the substrate 100, so as to improve the electrical performance of the non-volatile memory.

In summary, the afore-mentioned embodiments at least has the following advantages:

1. Through the non-volatile memory structure and the array thereof according to the present invention, the manufacturing process can be effectively simplified, further improving production efficiency of the products.

2. The non-volatile memory structure and the array thereof according to the present invention have desirable electrical performance.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A non-volatile memory structure, comprising:
a substrate;
a plurality of stacked patterns disposed on the substrate, each of the stacked patterns comprising a charge storage structure and a gate from bottom to top, wherein the charge storage structure at least comprises a charge storage layer, the stacked patterns are physically separated from each other, and an opening being located between every two adjacent stacked patterns in the first direction;
a plurality of stress patterns disposed on the substrate between two adjacent stacked patterns, respectively, in parallel and extending along the first direction, wherein the stress patterns are separated from each other in a second direction, the first direction intersecting the second direction and a height of the stress patterns is higher than a height of the charge storage layer and lower than a height of the plurality of stacked patterns;
a plurality of doped regions respectively disposed in the substrate below the stress patterns;
a plurality of word lines disposed above the stress patterns and the stacked patterns in parallel and extending along the second direction, wherein the stress patterns located above the doped regions are located below the word lines; and
a dielectric layer disposed directly above the word lines and between adjacent word lines and completely filling the openings, a material of the dielectric layer being a stress material.

2. The non-volatile memory structure of claim 1, wherein the plurality of doped regions are disposed in the substrate at two sides of each of the stacked patterns, respectively.

3. The non-volatile memory structure of claim 2, wherein a material of the stress patterns comprises a tensile stress material when the doped regions are N-type doped regions.

4. The non-volatile memory structure of claim 2, wherein a material of the stress patterns comprises a compressive stress material when the doped regions are P-type doped regions.

5. The non-volatile memory structure of claim 1, wherein a material of the charge storage layer comprises doped polysilicon or silicon nitride.

6. The non-volatile memory structure of claim 1, wherein a material of the stress patterns comprises silicon nitride.

7. The non-volatile memory structure of claim 1, wherein a width of each of the stress patterns is equal to a distance between every two adjacent stacked patterns.

8. A non-volatile memory array, comprising:
a substrate;
a plurality of isolation patterns disposed on the substrate in parallel and extending along a first direction, a material of the isolation patterns being a stress material;

a plurality of doped regions respectively disposed in the substrate below the isolation patterns;

a plurality of word lines disposed above the isolation patterns in parallel and extending along a second direction, the first direction intersecting the second direction;

a plurality of stacked patterns respectively disposed on the substrate below the word lines and between two adjacent isolation patterns, an opening being located between every two adjacent stacked patterns in the first direction, each of the stacked patterns comprising a charge storage structure and a gate from bottom to top, wherein the charge storage structure at least comprises a charge storage layer, the stacked patterns are physically separated from each other in the second direction, wherein the plurality of isolation patterns and the stacked patterns are disposed below the plurality of word lines; and a dielectric layer disposed directly above the word lines and between adjacent word lines and completely filling the openings, a material of the dielectric layer being a stress material.

9. The non-volatile memory array of claim 8, wherein a material of the charge storage layer comprises doped polysilicon or silicon nitride.

10. The non-volatile memory array of claim 8, wherein the stress material comprises silicon nitride.

11. The non-volatile memory array of claim 8, wherein the stress material comprises a tensile stress material when the doped regions are N-type doped regions.

12. The non-volatile memory array of claim 8, wherein the stress material comprises a compressive stress material when the doped regions are P-type doped regions.

13. The non-volatile memory array of claim 8, wherein a width of each of the isolation patterns is equal to a distance between every two adjacent stacked patterns in the second direction.

14. A non-volatile memory array, comprising:

a substrate;

a plurality of isolation patterns disposed on the substrate in parallel and extending along a first direction, and a height of the plurality of isolation patterns is lower than a height of a plurality of stacked patterns;

a plurality of doped regions respectively disposed in the substrate below the isolation patterns;

a plurality of word lines disposed above the isolation patterns in parallel and extending along a second direction, the first direction intersecting the second direction;

the plurality of stacked patterns respectively disposed on the substrate below the word lines and between two adjacent isolation patterns, an opening being located between every two adjacent stacked patterns in the first direction, each of the stacked patterns comprising a charge storage structure and a gate from bottom to top, wherein the charge storage structure at least comprises a charge storage layer, and the stacked patterns are physically separated from each other; and a dielectric layer disposed on the isolation patterns over the substrate and completely filling the openings, a material of the dielectric layer being a stress material.

15. The non-volatile memory array of claim 14, wherein a material of the charge storage layer comprises doped polysilicon or silicon nitride.

16. The non-volatile memory array of claim 14, wherein the stress material comprises silicon nitride.

17. The non-volatile memory array of claim 14, wherein the stress material comprises a tensile stress material when the doped regions are N-type doped regions.

18. The non-volatile memory array of claim 14, wherein the stress material comprises a compressive stress material when the doped regions are P-type doped regions.

* * * * *